(12) United States Patent
Alam et al.

(10) Patent No.: US 6,982,566 B1
(45) Date of Patent: Jan. 3, 2006

(54) METHOD AND APPARATUS FOR OPERATING A BURN-IN BOARD TO ACHIEVE LOWER EQUILIBRIUM TEMPERATURE AND TO MINIMIZE THERMAL RUNAWAY

(75) Inventors: Mohammed Alam, Milpitas, CA (US); William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/816,773

(22) Filed: Apr. 1, 2004

(51) Int. Cl.
*G01R 31/28* (2006.01)
(52) U.S. Cl. ...................... 324/760; 324/765
(58) Field of Classification Search ............. 324/754, 324/760, 765, 762, 761; 165/80.2; 438/14–18, 438/323; 257/724
See application file for complete search history.

(56) References Cited

U.S. PATENT DOCUMENTS

| | | | | |
|---|---|---|---|---|
| 4,839,587 A | * | 6/1989 | Flatley et al. ............... | 324/761 |
| 5,073,816 A | * | 12/1991 | Wakefield et al. .......... | 257/724 |
| 5,221,575 A | * | 6/1993 | Nakano et al. ............. | 428/323 |
| 6,392,431 B1 | * | 5/2002 | Jones ......................... | 324/760 |

\* cited by examiner

*Primary Examiner*—Vinh P. Nguyen
(74) *Attorney, Agent, or Firm*—Morgan, Lewis & Bockius LLP

(57) ABSTRACT

The present invention is a novel method and apparatus for burn-in testing an electronic device. A device under test (DUT) is attached to a burn-in board (BIB), a thermally conductive sheet is placed atop the DUT, the BIB is placed in an environmentally-controlled burn-in oven, and current is applied to the DUT. A test signal can be sent to the DUT and data received from the DUT to determine whether the DUT is working properly. Aluminum, copper, or any material as thermally conductive as aluminum may be used in the sheet. The sheet may have top or bottom surface areas that conduct more heat away from the device and into the ambient environment than that conducted by a flat sheet. The sheet may be applied to a plurality of DUTs simultaneously. Further, a second thermally conductive sheet may be located underneath the BIB and in thermal contact with it.

27 Claims, 10 Drawing Sheets

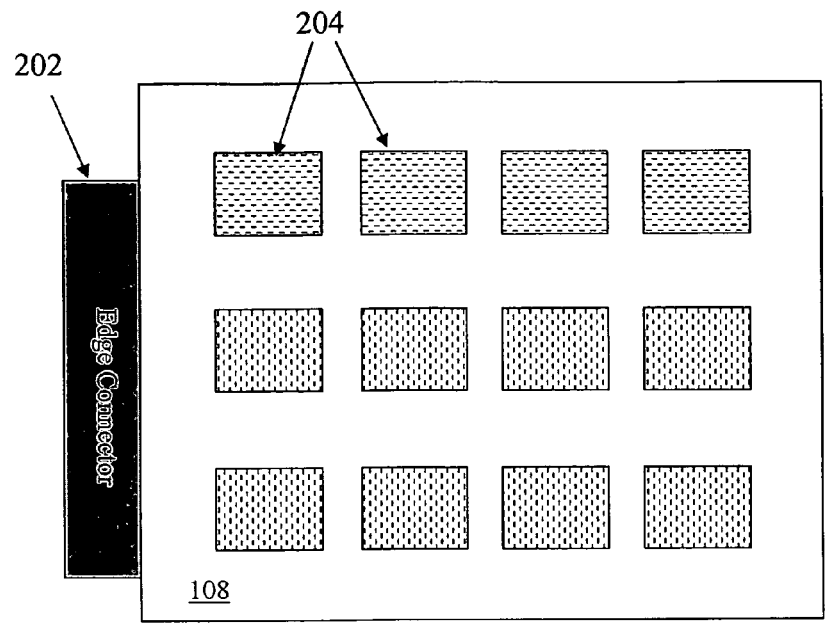
Fig. 2 (Prior Art)
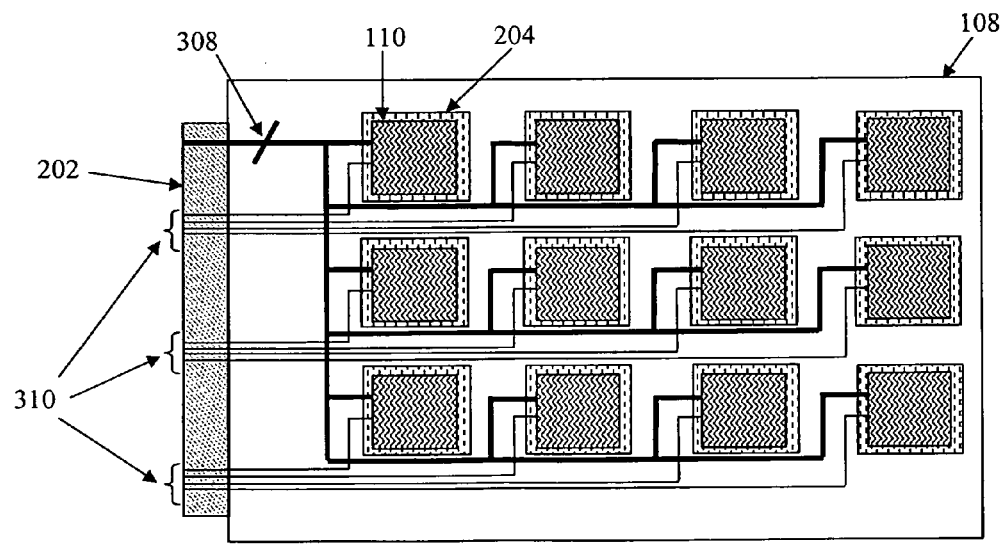
Fig. 3 (Prior Art)
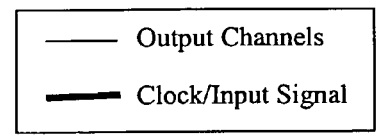

| Thermal Conductivity |||
|---|---|---|
| Material | Thermal conductivity (cal/sec)/(cm^2 C/cm) | Thermal conductivity (W/m K)* |
| Silver | 1.01 | 406.0 |
| Copper | 0.99 | 385.0 |
| Brass | ... | 109.0 |
| Aluminum | 0.50 | 205.0 |
| Iron | 0.163 | ... |
| Steel | ... | 50.2 |
| Lead | 0.083 | 34.7 |
| Mercury | ... | 8.3 |
| Ice | 0.005 | 1.6 |
| Glass, ordinary | 0.0025 | 0.8 |

METHOD AND APPARATUS FOR OPERATING A BURN-IN BOARD TO ACHIEVE LOWER EQUILIBRIUM TEMPERATURE AND TO MINIMIZE THERMAL RUNAWAY

The present invention relates generally to the testing of electronic devices in a burn-in process, and particularly to lowering the equilibrium temperature and minimizing occurrences of thermal runaway of electronic devices being tested on a burn-in board.

BACKGROUND OF THE INVENTION

Burn-in testing is a process used to screen early failures in electronic devices (e.g., semiconductor and integrated circuit devices) by operating the devices at elevated temperatures and elevated voltages over a period of time. This is accomplished by putting the devices under test (DUTs) in sockets on a printed circuit board (PCB) designed for such testing. These PCBs are usually referred to as burn-in boards (BIBs). BIBs are placed in an environmental chamber in a burn-in oven where they are connected to a current source for testing the operation of the DUTs. Basic burn-in testing may include providing only a clock signal to the DUTs to watch for the DUTs' responses thereto. Dynamic burn-in testing is a more sophisticated form of burn-in testing in that the burn-in test system has the additional capability to provide input stimuli to the DUTs. In such dynamic burn-in testing, clock and data signals exercise the device.

During burn-in, an electronic device is subjected thermally to both negative and positive feedbacks that affect the device's equilibrium temperature. The negative feedbacks are all parameters that cause an electronic device to cool down. These include the ambient temperature within an environmental chamber, if that ambient temperature is below the temperature of the electronic device, and the airflow in the environmental chamber.

Positive feedbacks include all parameters that cause an electronic device to heat up. One such parameter is thermal runaway. When a current source is connected to the BIBs with the DUTs in an environmental chamber during burn-in, the DUTs draw static current from the current source. "Static current" is the current that an electronic device draws when the device is turned on, but not in use. The amount of static current drawn by a device depends on device process, power up voltage, and temperature of the device. In addition to the static current, DUTs will draw dynamic current, if the burn-in is dynamic. "Dynamic current" is the current that an electronic device draws, in addition to static current, when the device is in use. The amount of dynamic current drawn by a device depends on how much of the total device is in use and how fast (clock frequency) it is being used. As the DUTs draw current from the current source, the DUTs produce heat, increasing the DUTs' temperature, which in turn causes the DUTs to draw more current. More current produces more heat and raises the temperature of the DUTs, causing the DUTs to draw still more current. This cycle, known as thermal runaway, can result in the temperature reaching the melting temperature of the DUTs. Thermal runaway results not only in the melting of the DUTs, but also the sockets in which the DUTs were attached during burn-in.

To minimize the risk of thermal runaway, burn-in testing has often been preceded by the sorting of the DUTs into groups of low, medium, and high static current devices. Each BIB is then used to burn-in only devices from a single group of devices at a temperature that minimizes the likelihood of thermal runaway for that device group. A drawback to this approach is that a device having a low static current may have reliability specifications that require a chamber environmental temperature that is higher than that which is used to test the device. This means that some devices cannot be tested at the temperature that is dictated by their reliability specifications. Another drawback to this approach is that it requires the additional test step of sorting the DUTs by static current level, a step involving a considerable amount of man and machine time that increases the production cost of the device.

SUMMARY OF THE INVENTION

The present invention addresses the aforementioned problems by a novel method and apparatus for burn-in testing an electronic device. The present invention increases the negative thermal feedback that works against positive thermal feed back (thermal runway) in order to lower the equilibrium temperature of electronic devices during burn-in.

In addition to the usual burn-in set up (BIB, sockets, DUTs), a thermally conductive sheet is placed atop the DUTs. This sheet helps to conduct heat away from the DUTs and into the environment of the chamber during burn-in. Since the sheet is thermally conductive and has a larger surface area than the total surface area of the DUTs alone, each DUT in contact with the sheet achieves a lower equilibrium temperature during burn-in than without the sheet. In particular, without the sheet, the equilibrium temperature of each device is typically 15–60° C. higher than the ambient chamber temperature. By constructing the sheet using an appropriate material, the equilibrium temperature of each DUT can be lowered to no more than 10–15° C. above the ambient chamber temperature. This lowering of each device's equilibrium temperature helps to minimize thermal runaway.

In addition to lowering the equilibrium temperature of each DUT, the thermally conductive sheet also serves to equalize all the devices' different equilibrium temperatures. Without the sheet, each DUT typically achieves an equilibrium temperature different from the other devices on the same BIB in the same burn-in oven. Because the sheet is in contact with each of the DUTs, it dissipates more heat from a DUT with a high static current and less heat from a DUT with a low static current. As a result, all of the DUTs upon which the sheet sits achieve the same or relatively similar equilibrium temperature. Because all the DUTs achieve the same equilibrium temperature, DUTs having significantly different static currents can be tested on a single BIB and at a single chamber temperature, thus making it unnecessary to sort the devices into different static current device groups. By removing the requirement for grouping devices based upon their static current, the sheet makes it possible to test together devices of different static current groupings that require the same temperature for reliability specifications. This allows for more efficient and accurate testing of electronic devices.

A second thermally conductive sheet may be positioned beneath the BIB such that the second thermally conductive sheet is separated from the BIB by an electrically insulating but thermally conductive sheet. The conduction of heat from the DUT to this second thermally conductive sheet can be enhanced if the device is attached to the BIB by a socket and an electrically insulating but thermally conductive slug is inserted through the socket such that the slug contacts both the bottom surface of the device and the top surface of the BIB.

BRIEF DESCRIPTION OF THE DRAWINGS

Additional objects and features of the invention will be more readily apparent from the following detailed description and appended claims when taken in conjunction with the drawings, in which:

FIG. 2 is a top view of a typical BIB.

FIG. 3 is a top view of a typical BIB showing channel connections.

DESCRIPTION OF THE PREFERRED EMBODIMENTS

Figure 1:
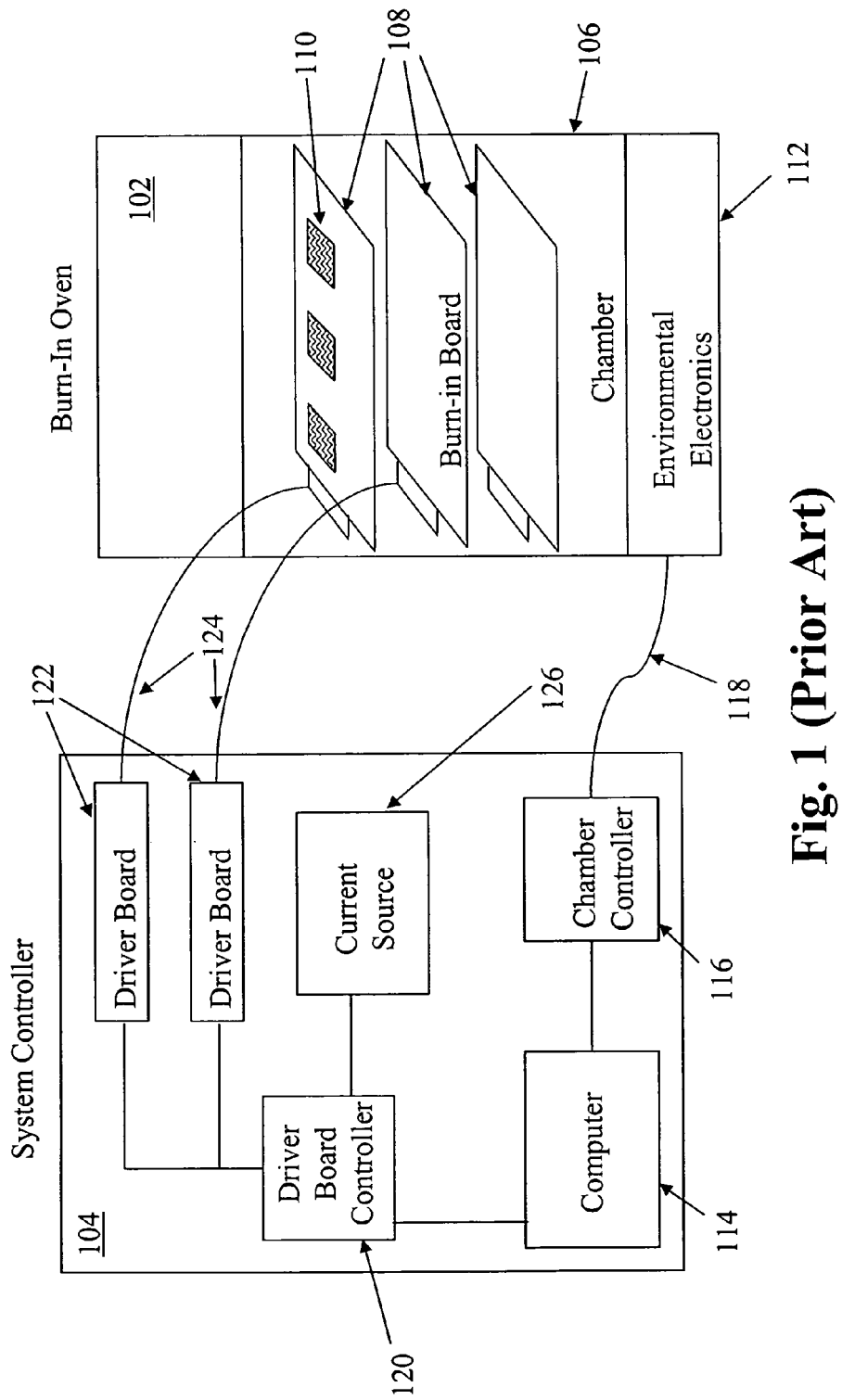
FIG. 1 is a schematic view of a conventional burn-in oven and burn-in system controller.

As shown in FIG. 1, a conventional burn-in system comprises two basic parts: a burn-in oven 102 and a system controller 104. Burn-in oven 102 includes environmental chamber 106 for holding one or more BIBs 108 during testing. BIBs 108 each hold one or more DUTs 110 in the BIB's sockets. Environmental chamber 106 is connected to environmental electronics 112 that control the heating of chamber 106 and any other environmental test conditions to which BIBs 108 are subjected. Such systems as the ATX and ATS-12000 systems manufactured by Aehr Test Systems of Menlo Park, Calif., are examples of the types of burn-in systems discussed herein.

System controller 104 comprises a computer 114, a chamber controller 116, a driver board controller 120, driver boards 122, and a current source 126. Burn-in oven 102 is connected to system controller 104 by at least two sets of connection wires: a set 118 from chamber controller 116 to environmental electronics 112, and a set 124 between driver boards 122 and BIBs 108. Computer 114 includes software programs, modules, and data for controlling the environmental test parameters of environmental chamber 106 using chamber controller 116 and environmental electronics 112.

Each BIB 108 is connected to a driver board 122 via a separate set of wires 124. Driver boards 122 provide current from current source 126 and test signals to the BIBs 108 for testing DUTs 110 thereon. Driver boards 122 also receive back through wires 124 any output or response signals from DUTs 110. Driver boards 122 in turn are coupled to driver board controller 120 that provides control signals to driver boards 122. For instance, a pattern generator (not shown) may be found either on driver boards 122 or in driver board controller 120. The pattern generator may provide clock signals and test data signals to driver boards 122 to be transmitted to DUTs 110 for testing. System controller computer 114 includes software programs, modules, and data to send instructions to driver board controller 120 and on to driver boards 122 to initiate and run the testing of DUTs 110. Additionally, computer 114 has memory for storing test data as well as data returned back from DUTs 110 during testing. Data returned back from DUTs 110 may then be analyzed and evaluated in computer 114.

FIG. 2 shows an example of a BIB 108 with edge connector 202 and device test sockets 204. Device test sockets 204 are coupled to a PCB that serves as BIB 108. For an example of device test sockets used with flip-chip type devices, see U.S. Pat. No. 5,419,710, to Pfaff, dated May 30, 1999, and entitled "Mounting Apparatus for Ball Grid Array Device," which is incorporated herein by reference. All power, test input, and test output signals are typically sent from system controller 104 to BIBs 108 through edge connector 202. FIG. 3 shows a conventional BIB 108 including various wires or channels employed in testing devices. DUTs 110 are coupled to BIB 108 by means of device test sockets such as device test sockets 204. Edge connector 202 provides the connection through which power and signals are applied to and output signals received from DUTs 110. Clock or input signal channel 308 is coupled to an input pin of each DUT 110. When DUTs 110 are being tested, an output pin for each DUT 110 is connected to a separate output channel 310. Thus, each DUT 110 drives an output signal on a separate output channel 310.

Figure 4:
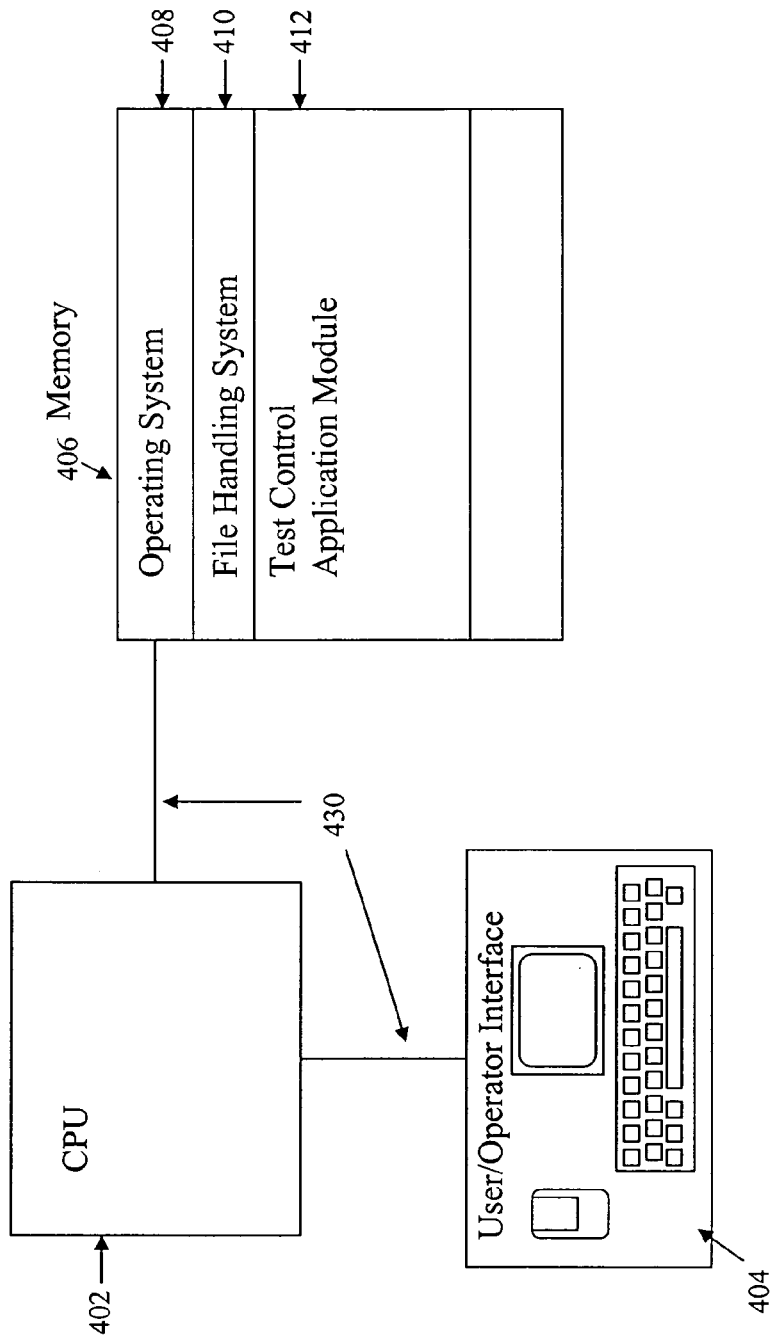
FIG. 4 is a schematic diagram of a system controller computer and program modules and instructions.

FIG. 4 shows an example of a system controller computer 114. Illustratively, system controller computer 114 comprises CPU 402 connected to user/operator interface 404 and memory 406. Memory 406 includes operating system 408, file handling system 410, and test control application module 412. Test control application module 412 sends instructions to chamber controller 116, which in turn controls the chamber environment through environmental electronics 112. Test control application module 412 also sends instructions to driver board controller 120 to provide control signals and/or current to BIBs 108 via driver boards 122.

Figure 5:
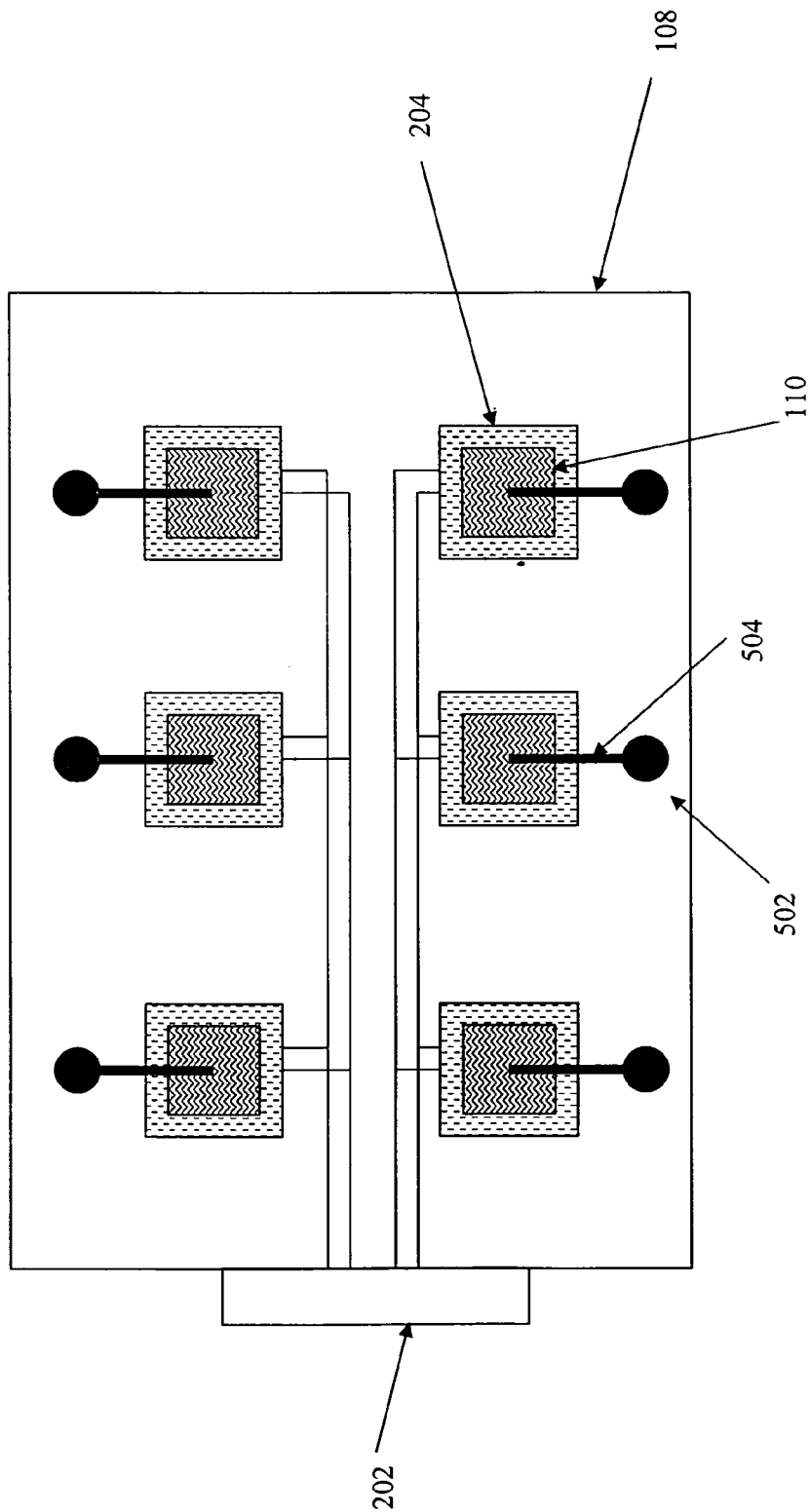
FIG. 5 is a top view of a conventional BIB showing spring mechanisms that are applying pressure to DUTs attached to the BIB's sockets.

FIG. 5 shows a typical BIB 108 that includes sockets 204 in which DUTs 110 sit. DUTs 110 are held firmly to sockets 204 by spring mechanisms 502, each of which includes a spring arm 504 that pushes down on a DUT. During burn-in, current is applied to DUTs 110 and test signals are sent to and received from DUTs 110 via edge connector 202. Each DUT 110 on a single BIB 108 usually has a different static current (i.e., Icc) value. Depending on that static current value and the chamber temperature, each DUT 110 on the single BIB 108 will have a different equilibrium temperature during burn-in. In prior art burn-in systems, some DUTs 110 run the risk of experiencing thermal runaway when their equilibrium temperatures reach the DUTs' 110 melting points. To avoid this, it was necessary to sort the DUTs into static current device groups, which presented the further problem of some devices not being tested at the temperature that is dictated by their reliability specifications.

Figure 6:
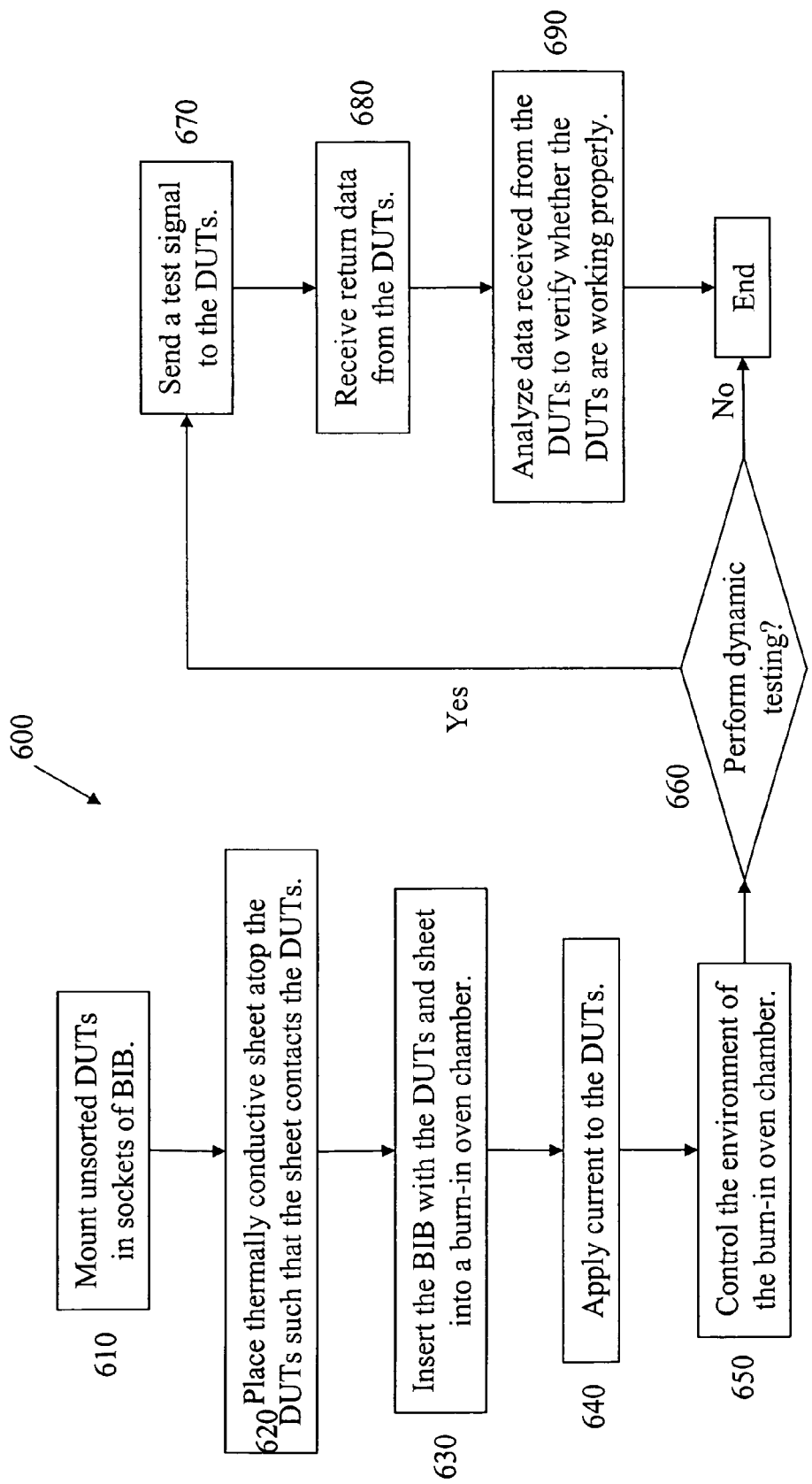
FIG. 6 is a flowchart describing one embodiment of the present invention.

In a preferred embodiment of the present invention illustrated in FIG. 6, DUTs need not be pre-sorted before being placed in the sockets of a single BIB. Rather, after the unsorted DUTs are mounted in the socket of a BIB at step 610, a thermally conductive sheet, serving as a heat pool, is placed at step 620 directly atop the DUTs such that the sheet contacts the DUTs. The entire set-up (including the BIB with edge connector and sockets, attached DUTs, and the sheet) is then placed in a burn-in oven at step 630, a current is applied to the DUTS at step 640, the chamber's environment is controlled at step 650, and the DUTs are tested. Further, the DUTs can undergo dynamic testing during which test signals are sent to the DUTs at step 670, return data is received from the DUTs at step 680, and the data is analyzed at step 690 to determine whether any DUTs are malfunctioning under the chamber conditions.

Figure 7:
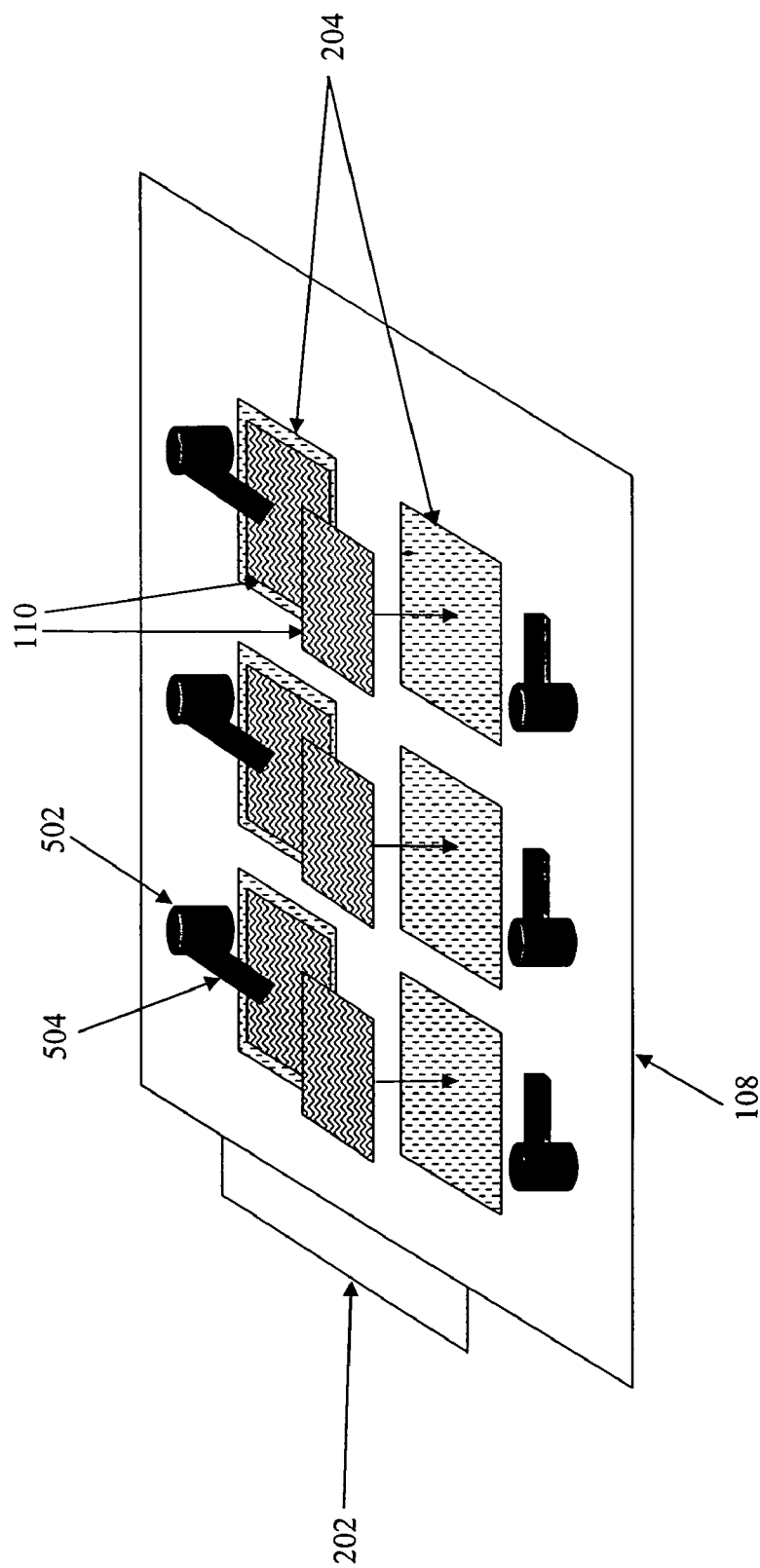
FIG. 7 is a perspective view of DUTs being attached to a BIB's sockets.
Figure 8:
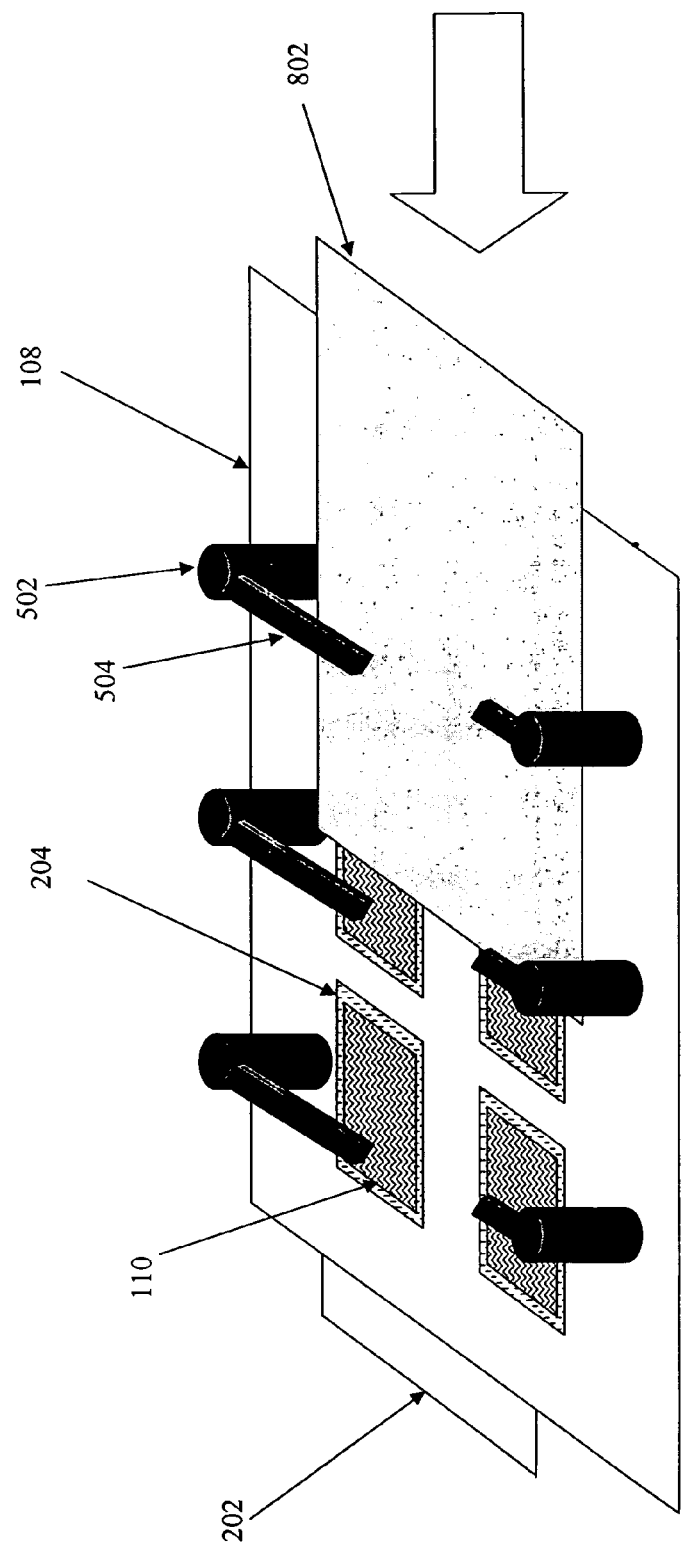
FIG. 8 is a perspective view of a thermally conductive sheet being positioned atop DUTs on a BIB.
Figures 9, 10:
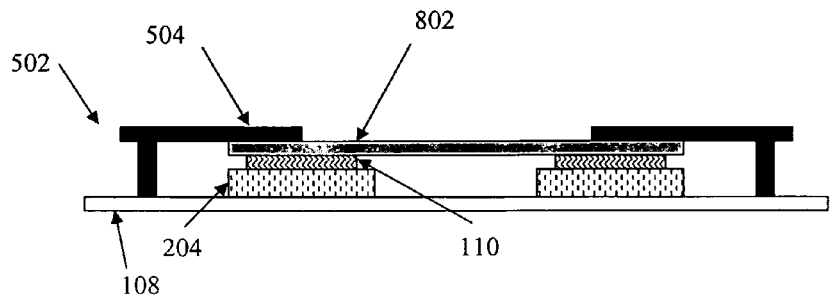
FIG. 9 is a cross-sectional view of a thermally conductive sheet positioned atop DUTs that are attached to the sockets of a BIB.
FIG. 10 is a table showing the thermal conductivity of various substances.

FIGS. 7 and 8 show a preferred embodiment of apparatus of the present invention. In FIG. 7, there is shown BIB 108 with sockets 204 and spring mechanisms 502 for each socket. The bottom row of DUTs 110 are shown being inserted into their respective sockets 204, and the top row of DUTs 110 are shown as having been inserted and attached to their respective sockets 204 with spring arms 504 of each respective spring mechanism 502 positioned to hold attached DUTs 110 firmly in place. Then, referring to FIG. 8, a thermally conductive sheet 802 is inserted between spring arms 504 of spring mechanisms 502 and DUTs 110. Spring arms 504 thus apply pressure against the sheet 802 such that the sheet 802 makes contact with DUTs 110. FIG. 9 is a cross-sectional view of thermally conductive sheet 802 positioned on top of DUTs 110, which are attached to sockets 204 in BIB 108. Spring arms 504 push down on sheet 802, causing sheet to contact DUTs 110. After sheet 802 is in place, DUTs 110 attached to sockets 204 of BIB 108 are placed into burn-in oven 102, chamber 106 of which is controlled by system controller computer 114 through chamber controller 116 and environmental electronics 112.

Since the efficiency of the thermally conductive sheet depends upon the conductivity of the material used and the surface area of the sheet itself, other preferred embodiments include the use of materials that are more thermally conductive than others, and different shapes of the sheet. FIG. 10 shows a table of conductivity for various materials. A preferred embodiment is the use of a thermally conductive sheet where the sheet is made of aluminum or has at least the thermal conductivity of aluminum. Another preferred embodiment is a sheet made of copper. Since copper has almost twice the thermal conductivity of aluminum, copper is preferred although it is generally more expensive than aluminum.

A specific preferred embodiment is a 12 inch by 2 inch by 1/32 inch copper sheet. Previously, without the sheet, equilibrium temperatures typically ranged 15–60° C. above the ambient temperature in the environmental chamber. Usually, if the ambient temperature is 125° C., an additional 45° C. in the equilibrium temperature will cause the DUTs to melt. With this particular preferred embodiment, the copper sheet lowered the equilibrium temperature of all DUTs to no more than 10–15° C. above the ambient temperature.

Figure 11:
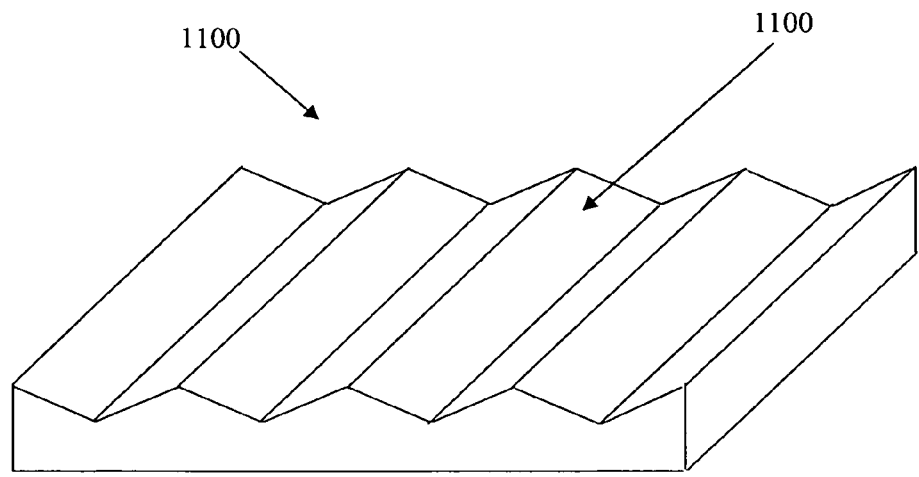
FIG. 11 is a perspective view of an embodiment of the present invention in which the surface area of the thermally conductive sheet is greater than that of a flat sheet.

In addition to varying the material for the thermally conductive sheet, one may also vary the surface area of the sheet to change its efficiency. FIG. 11 illustrates an embodiment of a sheet 1100 that increases the surface area (above that offered by a flat-surface sheet) that is available to conduct heat into the ambient environment of burn-in oven 102. Instead of a flat surface, the sheet 1100 has a crinkled or serrated top surface 1110 that has more surface area than a flat surface. This greater surface area allows more heat to dissipate from the crinkled surface than would dissipate from a sheet with a flat top surface.

Figure 12:
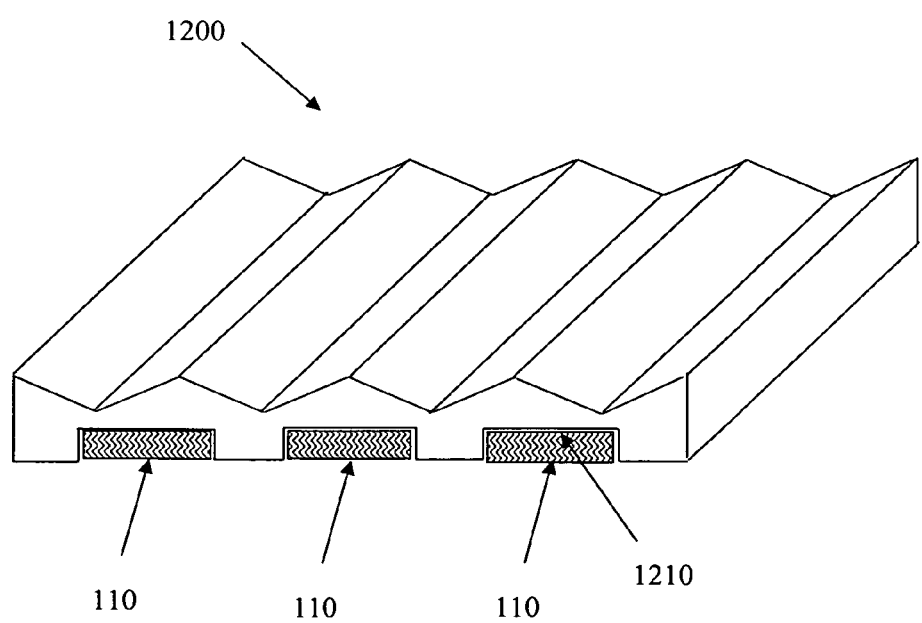
FIG. 12 is a perspective view of another embodiment of the present invention in which the area of contact between the thermally conductive sheet and the DUTs is greater than that of a flat sheet.

An additional preferred embodiment is illustrated in FIG. 12 in which the portion of sheet 1200 that contacts DUTs 110 is constructed to have a greater contact area with DUTs 110 than a sheet that has a flat bottom surface. This greater contact area with DUTs 110 causes the sheet to conduct more heat away from DUTs 110 than a sheet with a flat bottom surface. Instead of a flat bottom surface, the bottom surface 1210 of the sheet 1200 matches the surface shape of DUTs 110. This allows the bottom surface of sheet 1200 to contact the top surface and edges of DUTs 110 instead of limiting the contact to the top surface of DUTs 110.

Figure 13:
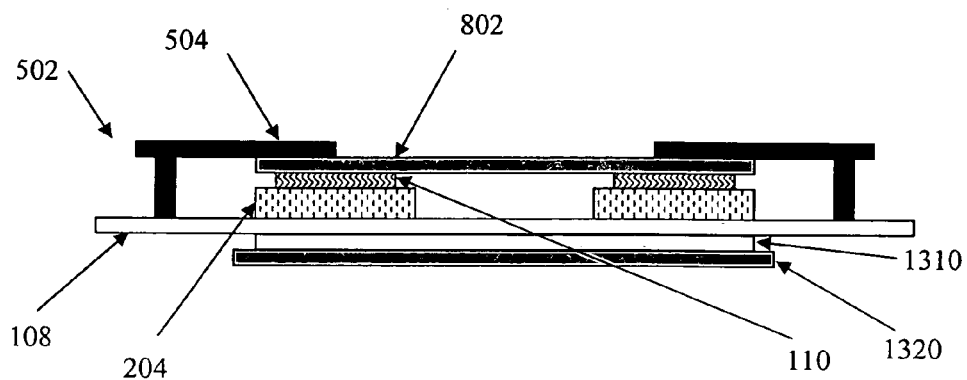
FIG. 13 is a cross-sectional view of an embodiment using two thermally conductive sheets, one positioned atop the DUTs, and the other positioned beneath the BIB.

FIG. 13, which includes all elements of FIG. 9, shows another embodiment using dual thermally conductive sheets 802, 1320. Thermally conductive sheet 1320 is positioned beneath BIB 108 and is separated from BIB 108 by an electrically insulating but thermally conductive sheet 1310. In one embodiment, sheet 1310 is composed of silicon rubber impregnated with aluminum oxide. Since sheet 1310 is electrically insulating but thermally conductive, sheet 1310 isolates sheet 1320 from BIB 108 electrically but not thermally. Sheet 1320 is thus able to conduct heat away from DUTs 110 through sockets 204, BIB 108, and sheet 1320. This conduction of heat away from DUTs 110 serves as a negative feedback in addition to the conduction of heat from DUTs 110 by sheet 802. This conduction of heat is especially useful because the socket is thermally conductive. An example of this is in Super Ball Grid Arrays (SBGA) and other peripheral ball packages (packages in which all the device pins or balls are at the periphery of the package), because all the balls (pins) of the DUT in a peripheral ball package are electrically connected to the BIB through copper springs or wires that pass through the socket.

Figure 14:
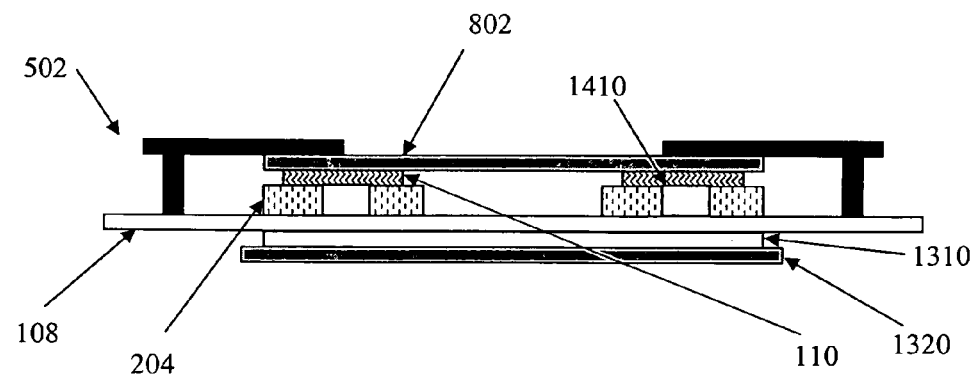
FIG. 14 is a cross-sectional view of another embodiment using two thermally conductive sheets.

FIG. 14 illustrates a further embodiment in which electrically insulating but thermally conductive slugs 1410 are inserted into sockets 204. Slugs 1410 contact the bottom surfaces of DUTs 110 as well as the top surface of BIB 108. Since the thermal conductivity of slugs 1410 is generally higher than that of sockets 204, more heat is conducted away from DUTs 110 using both slugs 1410 and sockets 204 in this embodiment than heat conducted away from DUTs 110 using only sockets 204 (as in the previous embodiment shown in FIG. 13). This embodiment is easily implemented in some SBGAs that have a socket with a hollow core into which slug 1410 can be inserted.

It should be clear to those skilled in the art that the present invention may apply to any burn-in testing or multiple device testing system, and to any devices that have bus capabilities whether they are in flip-chip configuration or otherwise. Multiple input signals, multiple output signals and more than one output enable signal may be used with the embodiments of the invention disclosed herein. The devices tested may have solder bumps or other electrical contacts. The methods of the present invention may include delays between row tests, and rows or columns or subsets of devices may be tested in any order. While two-dimensional embodiments (i.e. row and column) have been disclosed, embodiments utilizing methods expanded from those disclosed above are contemplated here as well. These embodiments may be referred to as three- or four-dimensional embodiments. A three-dimensional embodiment may include the use of multiple BIBs, each with its own thermally conductive sheet. A four-dimensional embodiment may include the use of multiple BIBs, each with its own thermally conductive sheet, and each BIB may be configured to test DUTs of a certain physical size range.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of burn-in testing an electronic device, comprising:
   attaching the device to a burn-in board;
   placing a first thermally conductive sheet atop the device such that the thermally conductive sheet contacts the device;
   placing a second thermally conductive sheet beneath the burn-in board and separated therefrom by an electrically insulating but thermally conductive sheet;
   inserting the burn-in board with the device and the thermally conductive sheets into a chamber, wherein the environment within the chamber is controllable;
   applying current to the device; and
   controlling the environment within the chamber.

2. The method of claim 1, wherein at least one of the thermally conductive sheets has at least the thermal conductivity of aluminum.

3. The method of claim 1, wherein at least one of the thermally conductive sheets is composed of aluminum.

4. The method of claim 1, wherein at least one of the thermally conductive sheets is composed of copper.

5. The method of claim 1, wherein the first thermally conductive sheet has dimensions configured to have a top surface area greater than that of flat surface.

6. The method of claim 1, wherein a portion of the first thermally conductive sheet that is in contact with the device is configured to have a greater contact area with the device than that of a flat surface.

7. The method of claim 1, further comprising:
   sending at least one test signal to the device;
   receiving data from the device; and
   analyzing the data received from the device.

8. The method of claim 1, wherein the electrically insulating but thermally conductive sheet is composed of silicon rubber impregnated with aluminum oxide.

9. The method of claim 1, wherein the device is attached to the burn-in board via a socket that includes an electrically insulating but thermally conductive slug that contacts both the bottom surface of the device and the top surface of the burn-in board.

10. The method of claim 9, wherein the slug is composed of silicon rubber impregnated with aluminum oxide.

11. The method of claim 1, wherein a plurality of electronic devices are burn-in tested simultaneously.

12. A method of burn-in testing a plurality of electronic devices, comprising:
    attaching the plurality of devices to a burn-in board;
    placing a first thermally conductive sheet atop the plurality of devices such that the thermally conductive sheet contacts the devices;
    placing a second thermally conductive sheet beneath the burn-in board and separated therefrom by an electrically insulating but thermally conductive sheet;
    inserting the burn-in board with the plurality of devices and the thermally conductive sheet into a chamber, wherein the environment within the chamber is controllable;
    applying current to each of the devices; and
    controlling the environment within the chamber.

13. The method of claim 12, wherein the device is attached to the burn-in board via a socket that includes an electrically insulating but thermally conductive slug that contacts both the bottom surface of the at least one of the devices and the top surface of the burn-in board.

14. An apparatus for testing an electronic device, comprising:
    a burn-in board to which the device may be attached;
    a first thermally conductive sheet that may be positioned atop the device such that the thermally conductive sheet contacts the device;
    a second thermally conductive sheet located beneath the burn-in board and separated therefrom by an electrically insulating but thermally conductive sheet;
    a controlled-environment chamber; and
    a current source that applies current to the device.

15. The apparatus of claim 14, wherein at least one of the thermally conductive sheets has at least the thermal conductivity of aluminum.

16. The apparatus of claim 14, wherein at least one of the thermally conductive sheets is composed of aluminum.

17. The apparatus of claim 14, wherein at least one of the thermally conductive sheet sheets is composed of copper.

18. The apparatus of claim 14, wherein the first thermally conductive sheet has dimensions configured to have a top surface area greater than that of a flat surface.

19. The apparatus of claim 14, wherein a portion of the thermally conductive sheet that is in contact with the device is configured to have a greater contact area with the device than that of a flat surface.

20. The apparatus of claim 14, further comprising:
    a test signal generator that sends at least one test signal to the device;
    a test signal receiver that receives data from the device; and
    a test signal analyzer that analyzes the data received from the device.

21. The apparatus of claim 14, wherein the electrically insulating but thermally conductive sheet is composed of silicon rubber impregnated with aluminum oxide.

22. The apparatus of claim 14, further comprising:
    a socket for attaching the device to the burn-in board; and
    an electrically insulating but thermally conductive slug inserted through the socket such that the slug contacts both the bottom surface of the device and the top surface of the burn-in board.

23. The apparatus of claim 22, wherein the slug is composed of silicon rubber impregnated with aluminum oxide.

24. The apparatus of claim 14, wherein the burn-in-board is configured so that a plurality of electronic devices may be mounted on the burn-in-board, and the first thermally conductive sheet is configured so that the first thermally conductive sheet contacts the plurality of electronic devices.

25. The apparatus of claim 14, further comprising at least one device for biasing the first thermally conductive sheet against the electronic device.

26. An apparatus for testing a plurality of electronic devices, comprising:
    a burn-in board to which the plurality of devices is attached;
    a first thermally conductive sheet that may be positioned atop the plurality of devices such that the thermally conductive sheet contacts the devices;
    a second thermally conductive sheet located beneath the burn-in board and separated therefrom by an electrically insulating but thermally conductive sheet:
    a controlled-environment chamber; and
    a current source that applies current to the devices.

27. The apparatus of claim 26, further comprising:
    sockets for attaching the devices to the burn-in board; and
    electrically insulating but thermally conductive slugs inserted through the sockets such that a slug contacts both the bottom surface of the device mounted in the socket and the top surface of the burn-in board.

* * * * *